United States Patent
O'Rourke et al.

(10) Patent No.: US 9,269,737 B1
(45) Date of Patent: Feb. 23, 2016

(54) FLAT PANEL IMAGE SENSOR AND METHOD OF MANUFACTURING THEREOF

(71) Applicant: dpiX, LLC, Colorado Springs, CO (US)

(72) Inventors: Shawn O'Rourke, Colorado Springs, CO (US); Robert Rodriquez, Colorado Springs, CO (US)

(73) Assignee: DPIX, LLC, Colorado Springs, CO (US)

(*) Notice: Subject to any disclaimer, the term of this patent is extended or adjusted under 35 U.S.C. 154(b) by 0 days.

(21) Appl. No.: 14/516,982

(22) Filed: Oct. 17, 2014

(51) Int. Cl.
| | |
|---|---|
| *H01L 27/14* | (2006.01) |
| *H01L 27/146* | (2006.01) |
| *H01L 27/12* | (2006.01) |
| *H01L 31/028* | (2006.01) |

(52) U.S. Cl.
CPC ...... *H01L 27/14636* (2013.01); *H01L 27/1248* (2013.01); *H01L 27/1259* (2013.01); *H01L 27/1463* (2013.01); *H01L 27/14612* (2013.01); *H01L 27/14643* (2013.01); *H01L 27/14689* (2013.01); *H01L 31/028* (2013.01)

(58) Field of Classification Search
CPC ........... H01L 27/14636; H01L 27/14643; H01L 27/1463; H01L 27/1248; H01L 27/1259; H01L 31/028; H01L 27/14612; H01L 27/14689

See application file for complete search history.

(56) References Cited

U.S. PATENT DOCUMENTS

2013/0187161 A1* 7/2013 Yamazaki ............ H01L 29/786
257/57

* cited by examiner

*Primary Examiner* — Roy Potter
*Assistant Examiner* — Paul Patton
(74) *Attorney, Agent, or Firm* — Peter J. Meza; Hogan Lovells US LLP

(57) ABSTRACT

A flat panel image sensor includes a thin film transistor (TFT) and diode array, a conformal insulating layer on a top surface of the TFT and diode array, a planarized dielectric layer on a top surface of the conformal insulating layer, a first metalized via in the planarized dielectric layer and the conformal insulating layer to contact a metalized portion of the TFT and diode array, a second metalized via in the planarized dielectric layer and the conformal insulation layer to contact a diode portion of the TFT and diode array, and a passivation layer over the first and second vias and an upper surface of the planarized dielectric layer.

22 Claims, 21 Drawing Sheets

FLAT PANEL IMAGE SENSOR AND METHOD OF MANUFACTURING THEREOF

FIELD OF THE INVENTION

The present invention relates to large area amorphous silicon imaging arrays and, more particularly, to a manufacturing method and corresponding device having improved reliability and performance due to the use of a planarized inter-layer dielectric.

BACKGROUND OF THE INVENTION

Imaging arrays and, in particular, large area amorphous silicon imaging arrays are adversely impacted by parasitic capacitances along the data and gate lines of the device. Currently, the inter-layer dielectric, which separates the data and gate lines, on digital imaging arrays is deposited by using a chemical vapor deposition (CVD) process. The topography of this layer over the array is highly varied/conformal, or non-planar. This non-planarity/conformality lends itself to thinner areas at data to gate crossovers leading to higher parasitic capacitances and degraded array performance. This non-planarity also contributes to lower reliability of the arrays by allowing moisture to penetrate through a seam that is propagated through each CVD process.

Referring now to FIG. 23, a prior art imaging array is shown including a glass substrate 302, a chrome metallization layer 304, a thin film transistor (TFT) including an island 306 and a gate 308, an amorphous silicon photodiode including an n+ layer 310, an intrinsic layer 312, a p+ layer 314, and an Indium Titanium Oxide (ITO) layer 316, and a conformal insulating layer 318. The prior art imaging array includes a first metalized via 322 for contacting the chrome metallization layer 304 and a second metalized via 324 for contacting the ITO layer 316 of the photodiode. The first and second vias 322 and 324, as well as other patterned metal areas on the surface of the conformal insulating layer 318 comprise a trilayer metallization including a Titanium-Tungsten (TiW) layer 326, an aluminum layer 328, and a Titanium-Tungsten (TiW) layer 330. The entire imaging array is passivated with a conformal passivation layer 332. The problem with the imaging array shown in FIG. 23 is that there is an ingress path 334 for moisture, which can damage the photodiode and decrease overall reliability.

What is desired is an amorphous silicon imaging array having improved reliability and addresses these problems in the prior art arrays.

SUMMARY OF THE INVENTION

According to the present invention, manufacturing a planarized digital imaging array with a hybrid dielectric approach improves the overall performance by decreasing parasitic capacitances. In addition, the planarized array also improves the environmental reliability of the product.

Manufacturing a multi-layer, hybrid, planarized array structure is accomplished by coating a combination of CVD based and liquid based ILD materials onto the thin-film transistor (TFT) sensor arrays. In brief, a hybrid dielectric structure consists of two layers of material (at least one CVD based and one solution based) to improve the overall topography of the device. Depending on the formulation of the ILD material and the processing approach, the solution process material can either be patterned by standard etch processes or it can be patterned directly using a lithographic process.

According to the present invention of manufacturing a hybrid dielectric array, an amorphous silicon photodiode is first capped with a CVD dielectric film. Following CVD, an additional solution-based dielectric film is coated on top of the CVD film. The solution-based dielectric can then be patterned using two approaches. In the first approach the solution processed ILD is directly patterned using lithography and in the second approach the solution processed ILD is cured after coating and subsequent process using photoresist and etch processes to form patterns. The benefit to these approaches is a more reliable device with lower parasitic capacitances without the need for an additional masking step.

DETAILED DESCRIPTION

Figure 1:
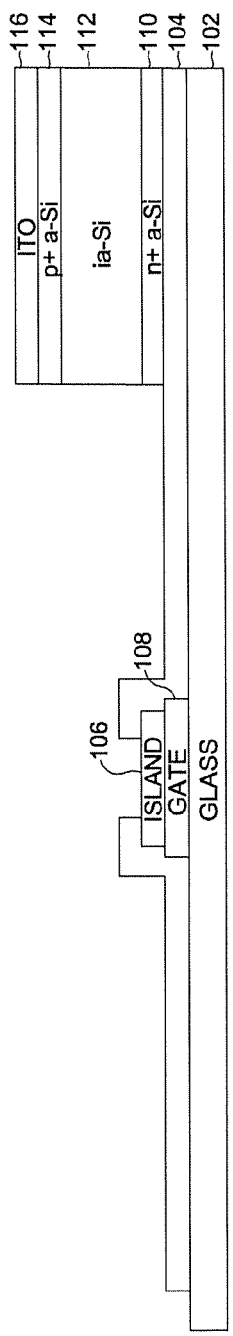
FIGS. 1-10 are cross-sectional diagrams illustrating a first manufacturing method for providing an improved reliability large area amorphous silicon imaging array according to the present invention.

The method of manufacturing flat panel sensors according to the present invention comprises depositing a CVD capping layer on top of the sensor followed by extruding a solution-based inter-layer dielectric (ILD) material on top. The ILD material can then be photo-exposed or etched depending on the electrical and physical requirements of the device.

The first step of the process is to deposit a sensor and TFT capping layer comprising a single layer or a combination of CVD films. More specifically, the first step in a hybrid dielectric process is to deposit an oxide or oxynitride dielectric. Even more specifically the CVD film is an individual layer or combination of $SiO_2$ and/or SiON. This is an important process step; the insitu vacuum capping of the a-Si photodiode serves as a temporary moisture barrier prior to final capping of the device. If the sensor sidewall is exposed to atmosphere, which contains water, for an extended period of time, the sensor will exhibit higher leakage and deleterious performance. Following CVD deposition the next step is to coat the solution process material onto the CVD layer by using an extrusion or spin-coating process. After coating, the material is ready for further processing.

According to the present invention there are two approaches to take once the solution process material has been coated on the substrate. The first process is to use conventional photoresist definement and etching of the hybrid stack. The second approach is to use a photo-exposable solution process dielectric and pattern the solution processed layer of the dielectric as if it were a photoresist.

The first approach is to use a dry-etchable, liquid ILD chemical. After coating the sensor array with ILD, the material is then cured at approximately 200° C.+/−50° C. for one hour in Nitrogen. The temperature, time and atmosphere may differ depending on the requirements of the ILD material or the subsequent processing steps in the manufacturing of the image sensor. It is critical for the remaining processes to be less than the curing temperature of some ILD materials. Other materials will allow higher-temperature processing post cure. A SiON etch capping layer, hereafter referred as SiON etch layer, may be applied onto the ILD material. The SiON etch layer, acts as method of preventing the ILD material from being etched during subsequent etch processes. The dry-etchable material is masked using lithography and etched using a $CF_4:O_2$ mixture or any other fluorinated plasma chemical.

The second approach is to use a photoimageable ILD material. The photoimageable ILD material does not require the SiON etch-layer as it can be masked directly without the use of photoresist. Once the material is patterned, then it can be cured at approximately 250° C.+/−50° C. for one hour in Nitrogen. Depending upon the photo-exposable material, the temperature, time and atmosphere may differ. The SiON or other CVD dielectric layer is then etched by using a dry-etch process. The ILD material acts as the etch block, or resist layer, so it is not necessary to coat the ILD material with resist and mask it to remove the SiON in the vias. It still is possible, if the process requires it, to perform the lithographic process (i.e., resist coat and mask) on the ILD material if needed.

At this point, both approaches merge and continue using the same process henceforth.

The next step is to deposit the top metal layer. This process consists of using a tri-layer metal stack, beginning from the bottom layer, of TiW, Al, and TiW or Chrome, Al, and TiW. The top metal tri-layer stack is deposited by physical vapor deposition (PVD). The metal layers are deposited using a low-temperature (<100° C.) or room-temperature process to prevent any cracking of the ILD film. The low temperature process is achieved by keeping the power to approximately 16 kilowatts. Some adjustments can be made to the power to accommodate any uniformity issues. It is important that the temperature stay below the curing temperature of the ILD film in order to prevent any blistering, delamination or cracking. The thickness of each tri-layer stack depends upon the electrical and process requirements of the circuit. The tri-layer stack is required to prevent hillocks from forming in the aluminum layer. Each metal layer is etched by using a wet-etch or dry-etch process or combination thereof The final etch step is performed on the metal stack to remove the remaining TiW tip using a wet-etch process.

The final passivation layer is deposited by CVD. The passivation layer consists of SiON and SiN layers. The SiN acts as a final hermetic seal for the sensing array. It is important that the deposition temperature is less that the curing temperature of the ILD film. Once the passivation film is deposited onto the sensing array, it is then masked using lithography and etched using a dry-etch process.

Example 1

Using a liquid ILD material results in lower parasitic capacitances, which improves the performance of the sensor array. The performance gain lies in faster response in collecting data from the sensor by reducing the capacitive effects of the data lines and also the gate lines. The data-to-gate capacitance is also reduced, which decreases the switching speed of the TFT. This allows the data to be collected from the sensor much quicker.

Example 2

Using a liquid ILD material results in a substrate that has reduced stress, which improves plate handling by manufacturing tools. The current ILD material, SiON, exhibits high compressive stress and can cause the substrate to bow, or deform.

FIGS. 1-10 show a first manufacturing method according to the present invention. FIGS. 1-10 are cross-sectional views of an imaging array at various processing steps according to the first method of the present invention. Layers remaining in a subsequent figure and described in a preceding figure may not be described again with respect to the subsequent figure.

Referring now to FIG. 1, a cross-sectional view of a partially completed TFT and diode imaging array are shown, including the glass substrate 102, TFT gate 108 and island 106, and chrome metal layer 104. Also shown in FIG. 1 is a diode stack including an n+ amorphous silicon layer 110, an intrinsic amorphous silicon layer 112, a p+ amorphous silicon layer 114, and an ITO layer 116.

Figure 2:
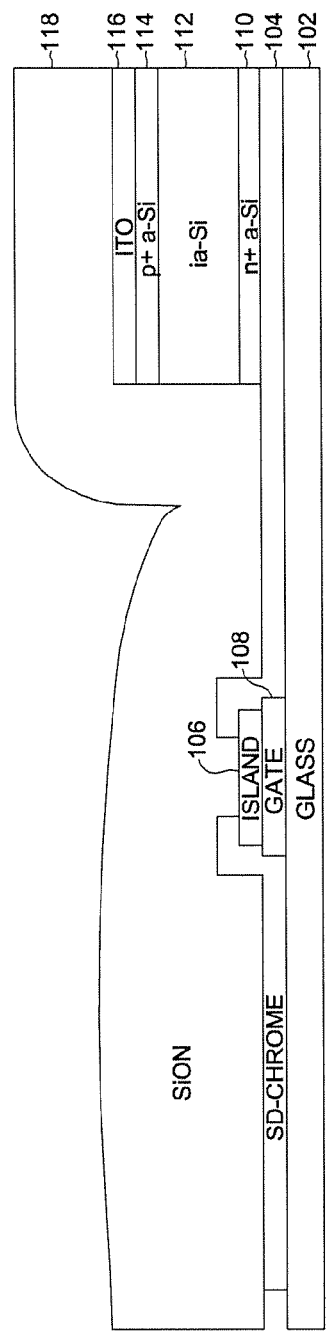

Referring now to FIG. 2, a SiON film 118 (approximately 0.5 microns to 2.0 microns thick) is applied onto the TFT and diode sensor stack using plasma-enhanced chemical vapor deposition (PECVD). The CVD process temperature is ideally between 200° C. and 300° C. Alternative insulating materials to SiON can include $SiO_2$ and SiN.

Figure 3:
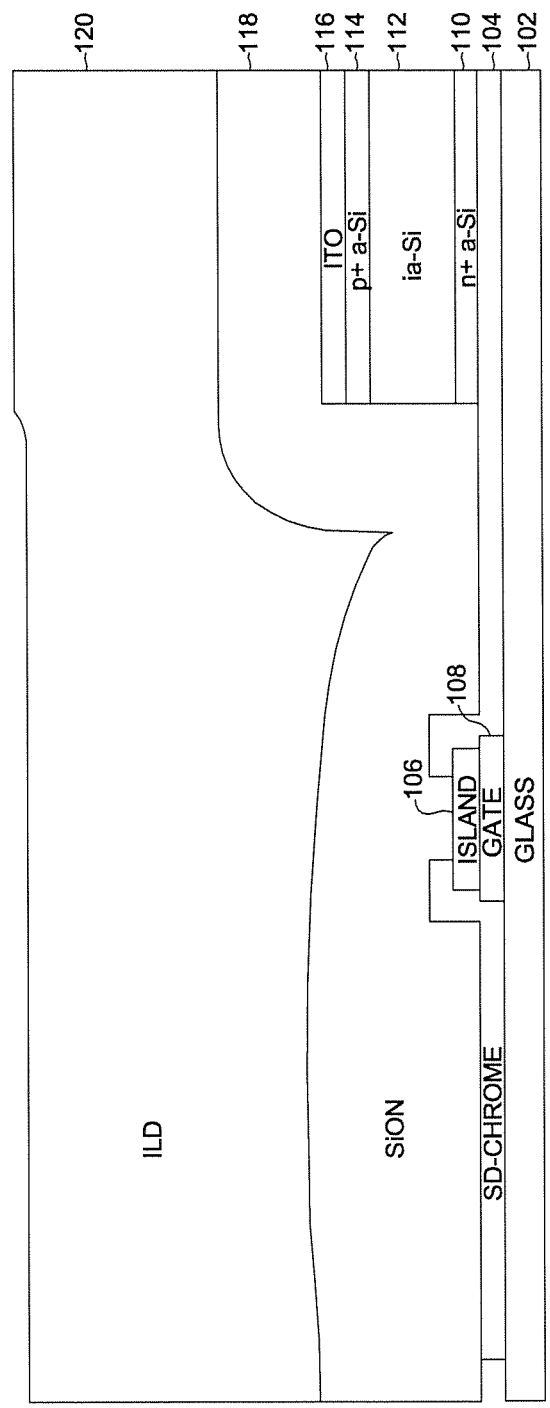

Referring now to FIG. 3, an Interlayer Dielectric layer (ILD) 120 is deposited using a solution process such as extrusion, slot die, spin coating, spray coating, or an inkjet process. The ILD layer has an ideal thickness of about one to six microns. The ILD layer is deposited at an ambient temperature followed by a soft bake at a temperature of about 50° C. to 100° C. to remove solvents. The ILD layer materials may include but are not limited to Dow Chemical Cyclotene 6100 series (or variants thereof), Microchem SU-8, TOK TPIR PN-0371 D, JSR Optmer or other photoexposable materials common in the art. The ILD material provides excellent planarization (greater than 90%) over the entire substrate.

Figure 4:
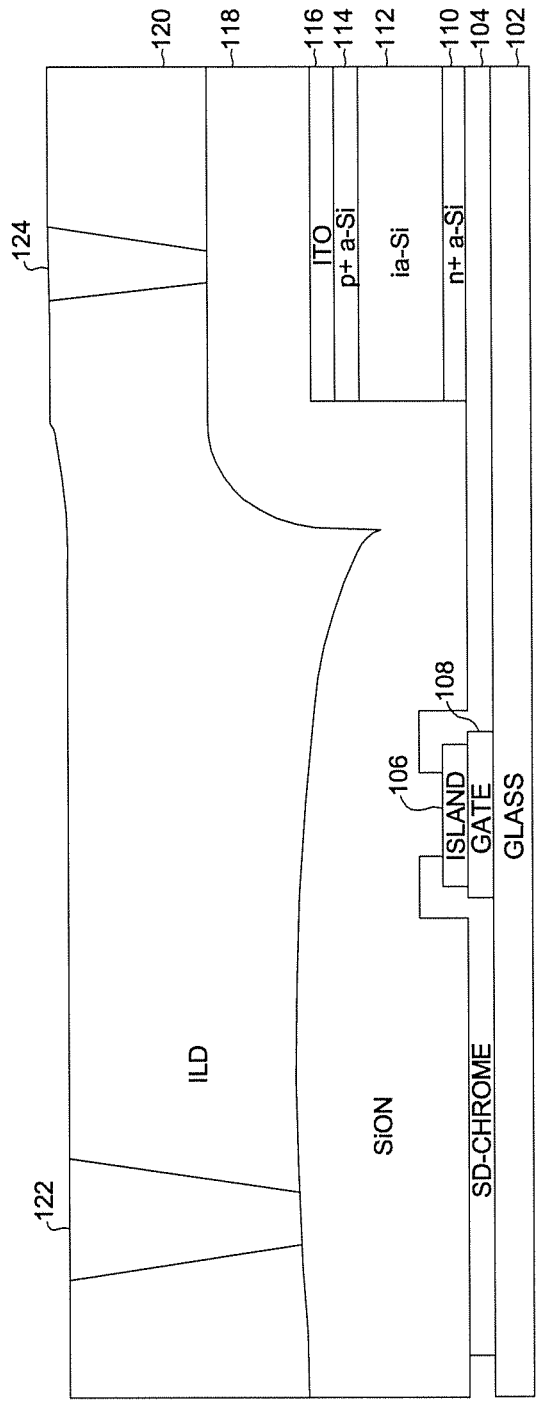

Referring now to FIG. 4, the ILD material is photoexposed (negative or positive tone) and subsequently develop to form via patterns 122 and 124 down to the SiON layer 118. A typical photoexposure dose range is between 300 milli Joules to 400 milli Joules. Following the developing step and inspection, the ILD material 120 is cured at a temperature range of between 200° C. to 300° C. (ideally less than 250° C.) in a nitrogen (N2) atmosphere for one to six hours.

Figure 5:
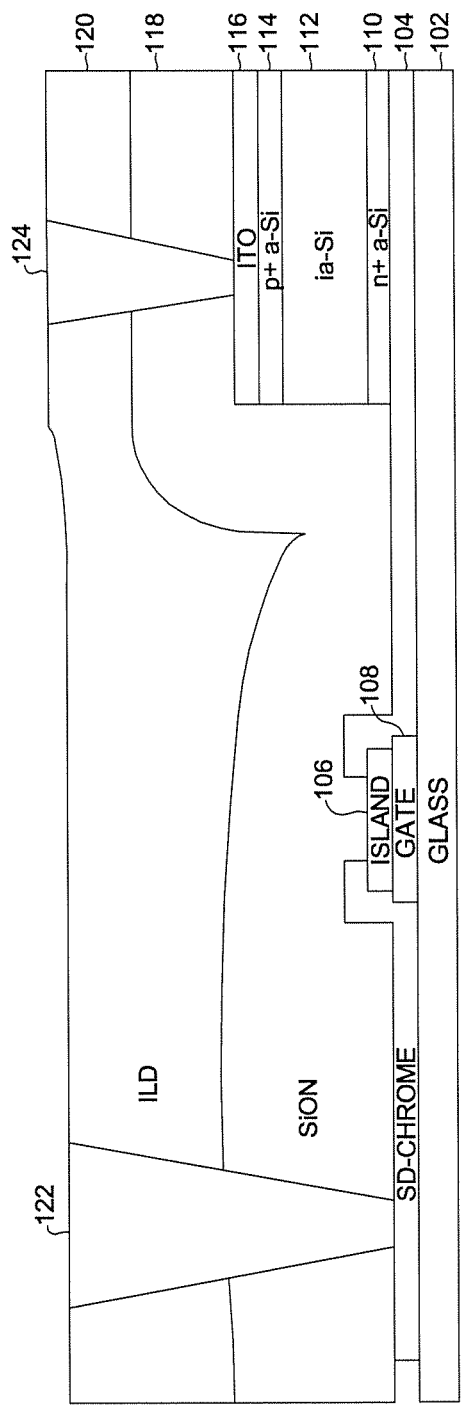

Referring now to FIG. 5, after curing the ILD layer 120, the SiON layer is etched using either wet (HF type chemistry) or dry (fluorine plasma; ideally CF4 or SF6). In either approach, the ILD layer 120 acts as an etch mask, but is not removed from the structure like a conventional photoresist. Note that via 122 is extended to the chrome metal layer 104 and via 124 is extended to the ITO layer 116 of the diode stack during this process step.

Figure 6:
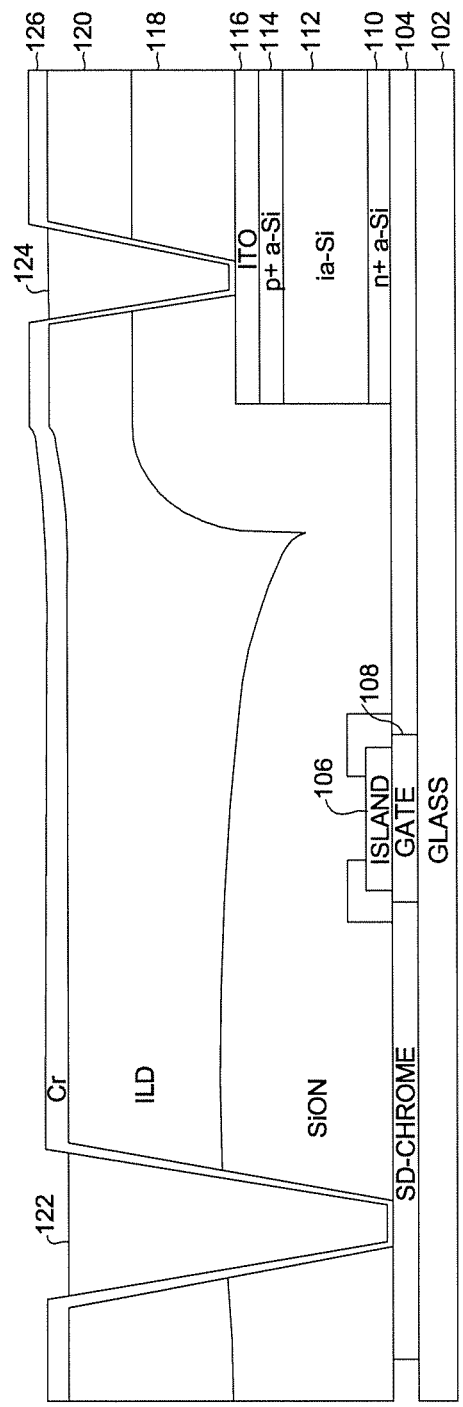

Referring now to FIG. 6, following the etching step, a chrome metal interconnect layer 126 is deposited using PVD/sputtering. This process includes using a tri-layer metal stack (described in further detail below), beginning from the bottom layer of TiW, Al, and TiW, or, Chrome, Al, and TiW. Typical film thickness is 200 Angstroms to 1000 Angstroms for the bottom layer, 1000 Angstroms to 10000 Angstroms for the middle layer, and 200 Angstroms to 1000 Angstroms for the top layer. All depositions are made at a temperature of less than 100° C. Alternatives to this approach include replacement of Chromium or TiW with other refractory materials (for example Mo, MoW, Ti, etc.). The aluminum conductor can be replaced with other conductive materials (for example Cu, Al:Nd, Al:Si, Ag, etc.). Alternatively, the tri-layer metal stack may also incorporate a quad layer wherein a conductive oxide is deposited as the final layer (for example ITO, IGZO, IZO, ITZO, AZO, etc.).

Figure 7:
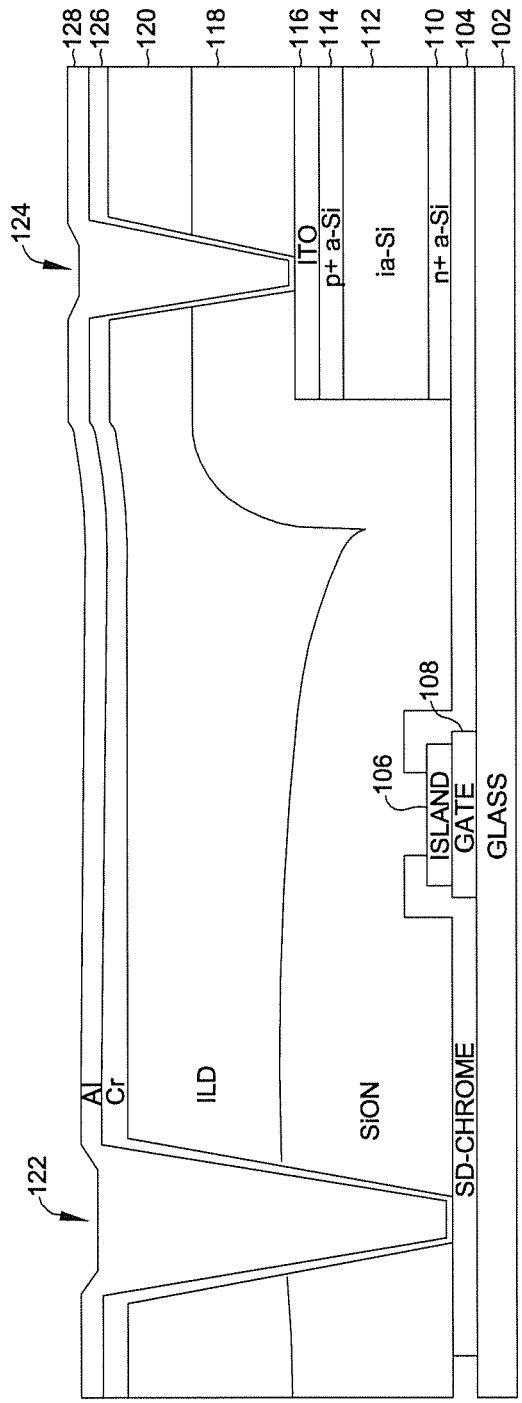

Referring now to FIG. 7, the aluminum "middle" layer 128 is deposited and fills vias 122 and 124.

Figure 8:
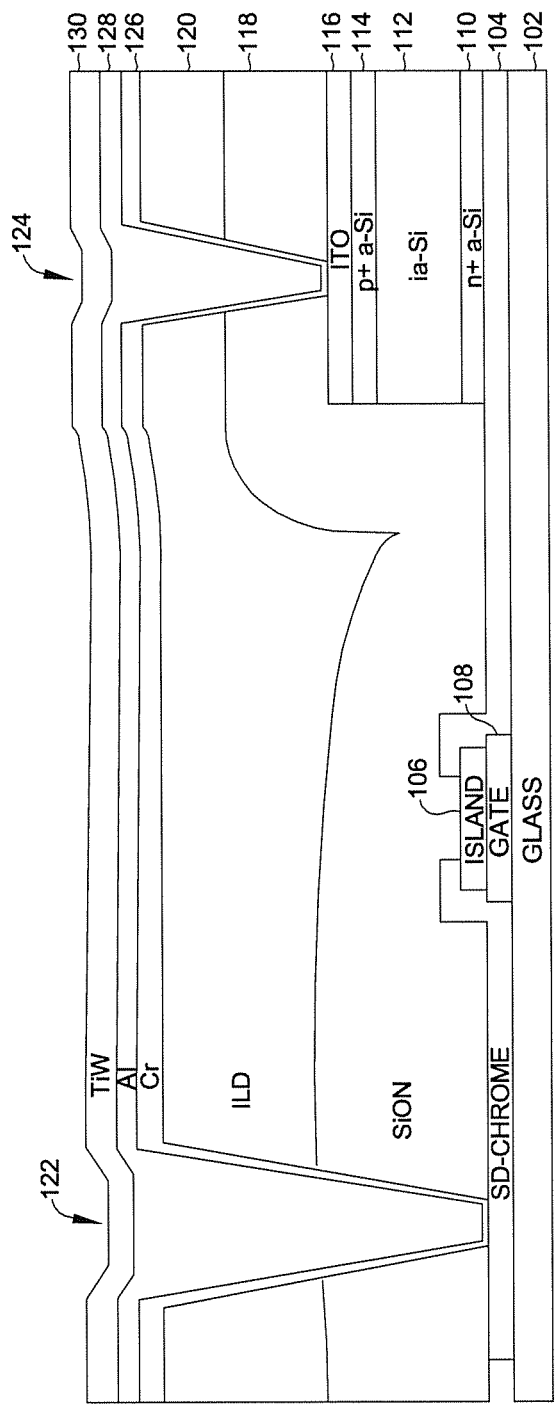

Referring now to FIG. 8, the TiW "top" layer 130 is deposited, covering vias 122 and 124 and the entire surface of the imaging array.

Figure 9:
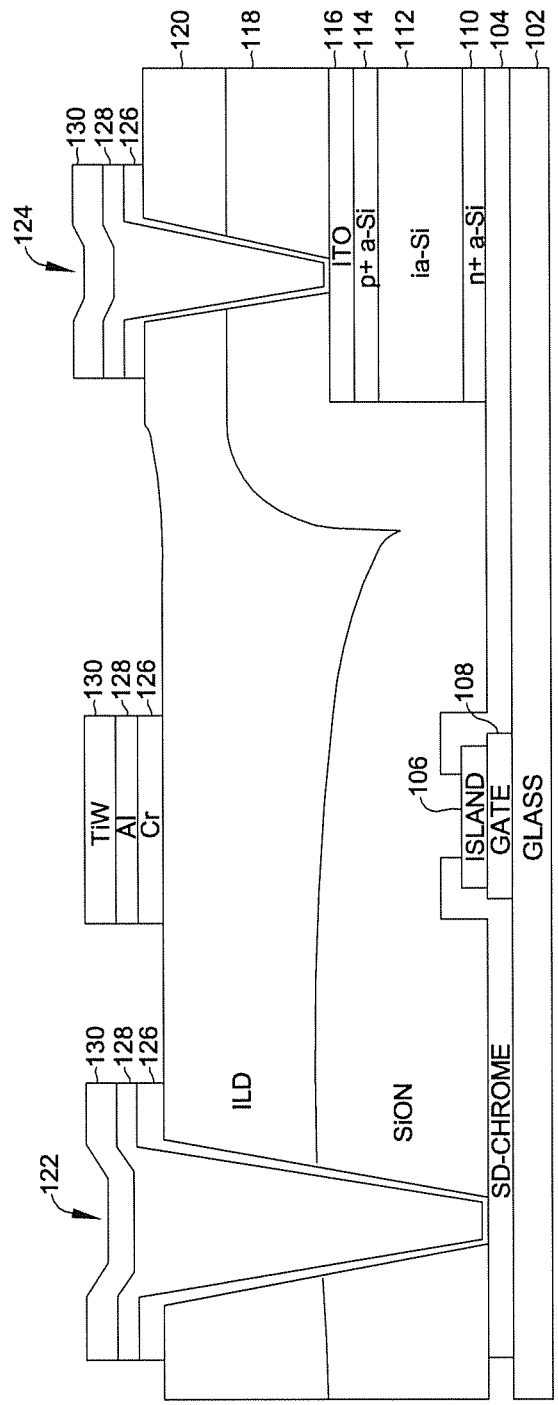

Referring now to FIG. 9, the metal tri-layer stack is patterned using i-line lithography and etched using either wet or dry process chemistries. Three patterned areas are shown in FIG. 9, including one associated with via 122, one associated with via 124, and a third patterned area midway between the first two patterned areas as shown.

Figure 10:
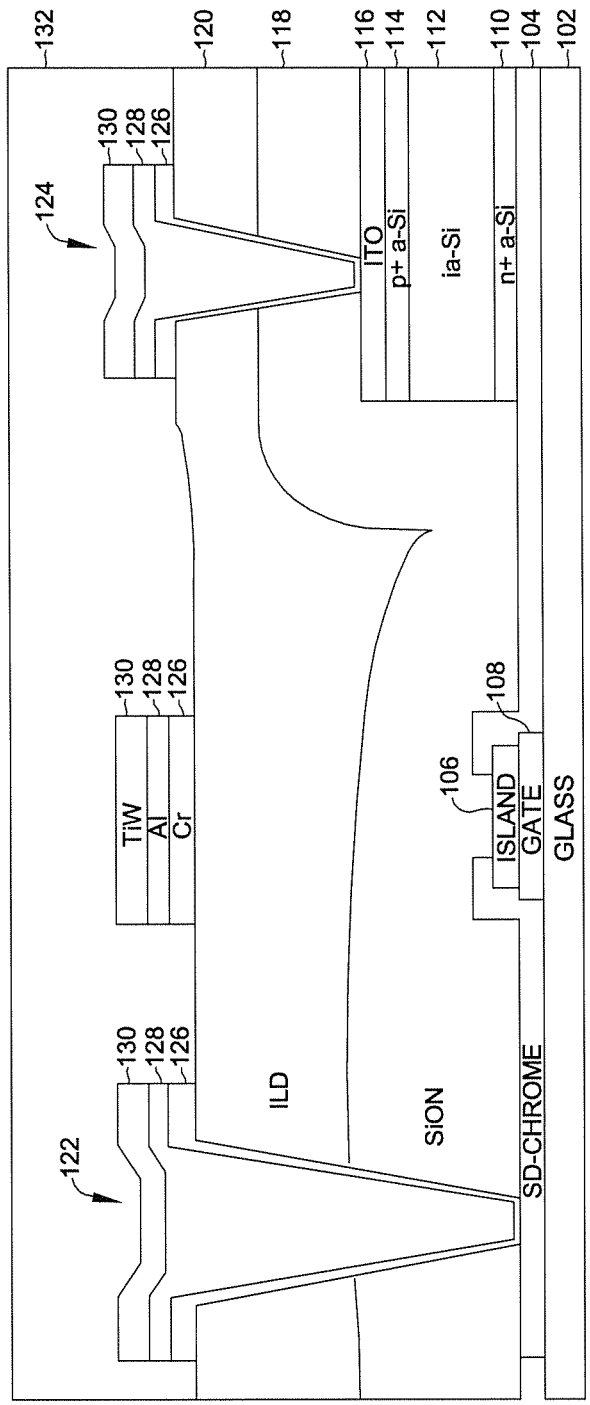

Referring now to FIG. 10, the top surface of the imaging array is passivated with passivation layer 132 using a PECVD process containing either an SiOn/SiN bilayer or an SiN monolayer. The PECVD process temperature is less than 300° C., preferably less than 240° C. The thickness of the passivation layer 132 is between 0.5 microns and 2.5 microns.

FIGS. 11-22 show a second manufacturing method according to the present invention. FIGS. 12-22 are cross-sectional views of an imaging array at various processing steps according to the first method of the present invention. Layers remaining in a subsequent figure and described in a preceding figure may not be described again with respect to the subsequent figure.

Figure 11:
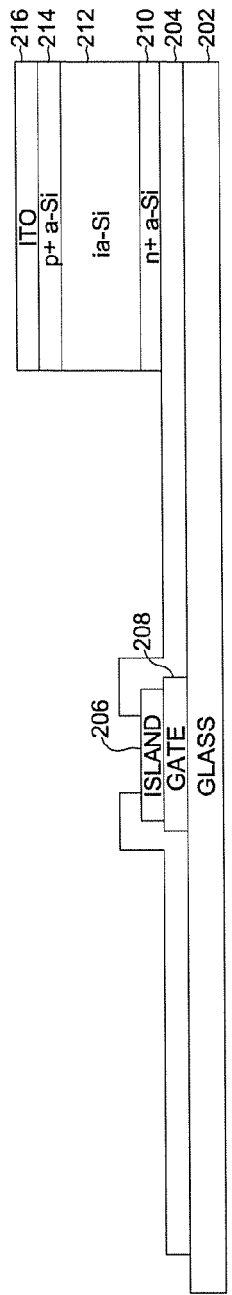
FIGS. 11-22 are cross-sectional diagrams illustrating a second manufacturing method for providing an improved reliability large area amorphous silicon imaging array according to the present invention.
Figure 12:
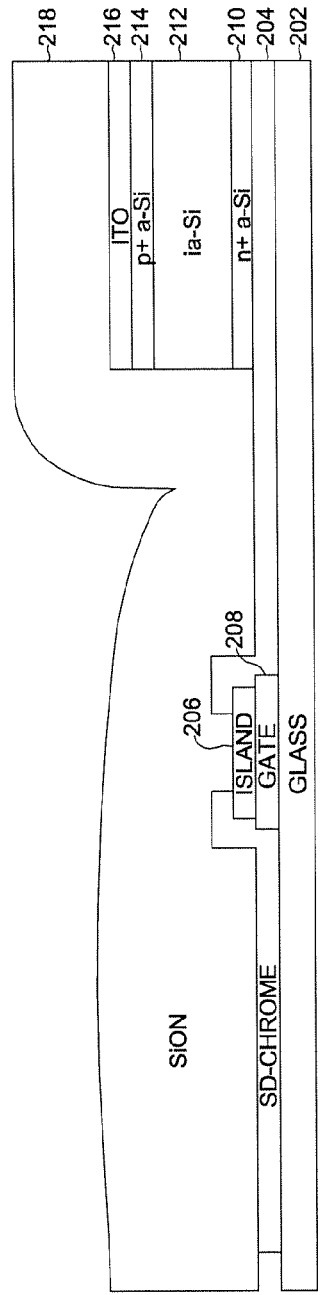
Figure 13:
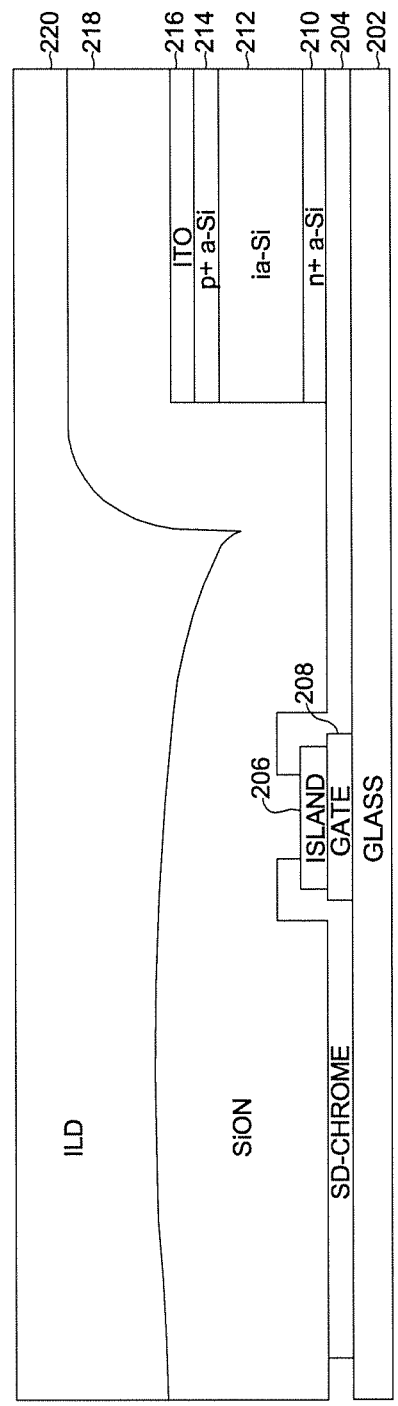

FIGS. 11-13 generally correspond to FIGS. 1-3, previously described. Referring now to FIG. 11, a cross-sectional view of a partially completed TFT and diode imaging array are shown, including the glass substrate 202, TFT gate 208 and island 206, and chrome metal layer 204. Also shown in FIG. 11 is a diode stack including an n+ amorphous silicon layer 210, an intrinsic amorphous silicon layer 212, a p+ amorphous silicon layer 214, and an ITO layer 216.

Referring now to FIG. 12, an SiON film 218 is applied onto the TFT and diode sensor stack using plasma-enhanced chemical vapor deposition (PECVD).

Referring now to FIG. 13, an Interlayer Dielectric layer (ILD) 220 is deposited to form a planarized layer as previously described. The ILD material layer 220 is cured at a temperature of 200° C. to 300° C., and ideally less than 250° C. in an N2 atmosphere for 1-6 hours followed by coating with a photoresist layer 221.

Figure 14:
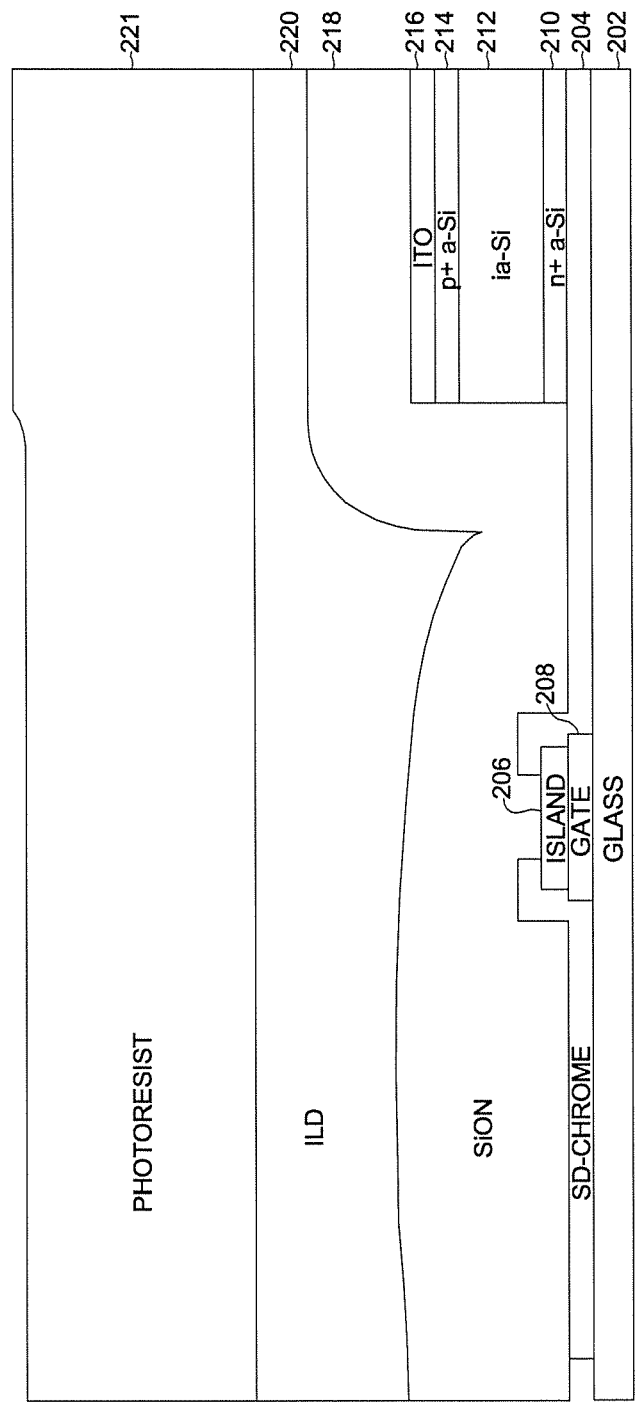

Referring now to FIG. 14, photoresist is applied on top of the ILD material.

Figure 15:
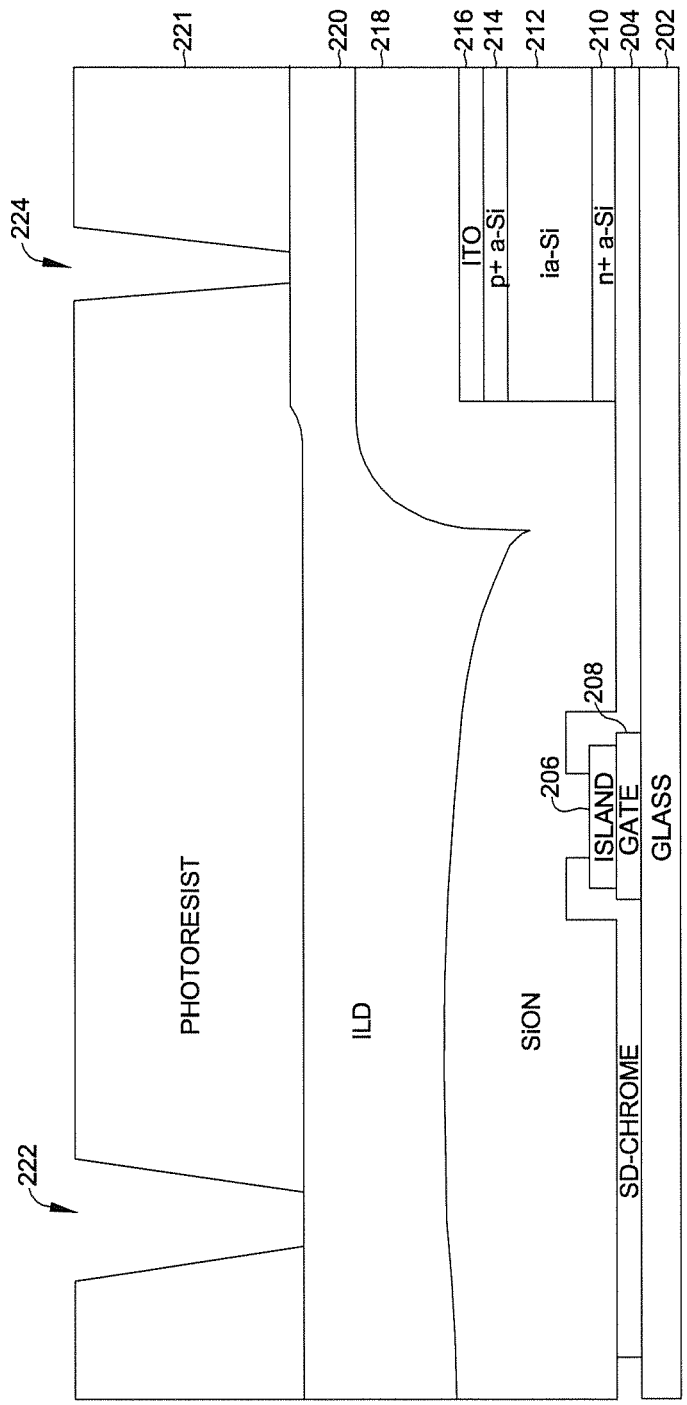

Referring now to FIG. 15, the photoresist layer 221 is patterned by i-line exposure and developed to form via patterns 222 and 224 down to the ILD layer 220. A typical dose range for the photoexposure is between 75 milli Joules to 200 milli Joules (ideally between 90 and 125 milli Joules). The thickness of the photoresist layer is between one and 10 microns, and ideally between two and five microns.

Figure 16:
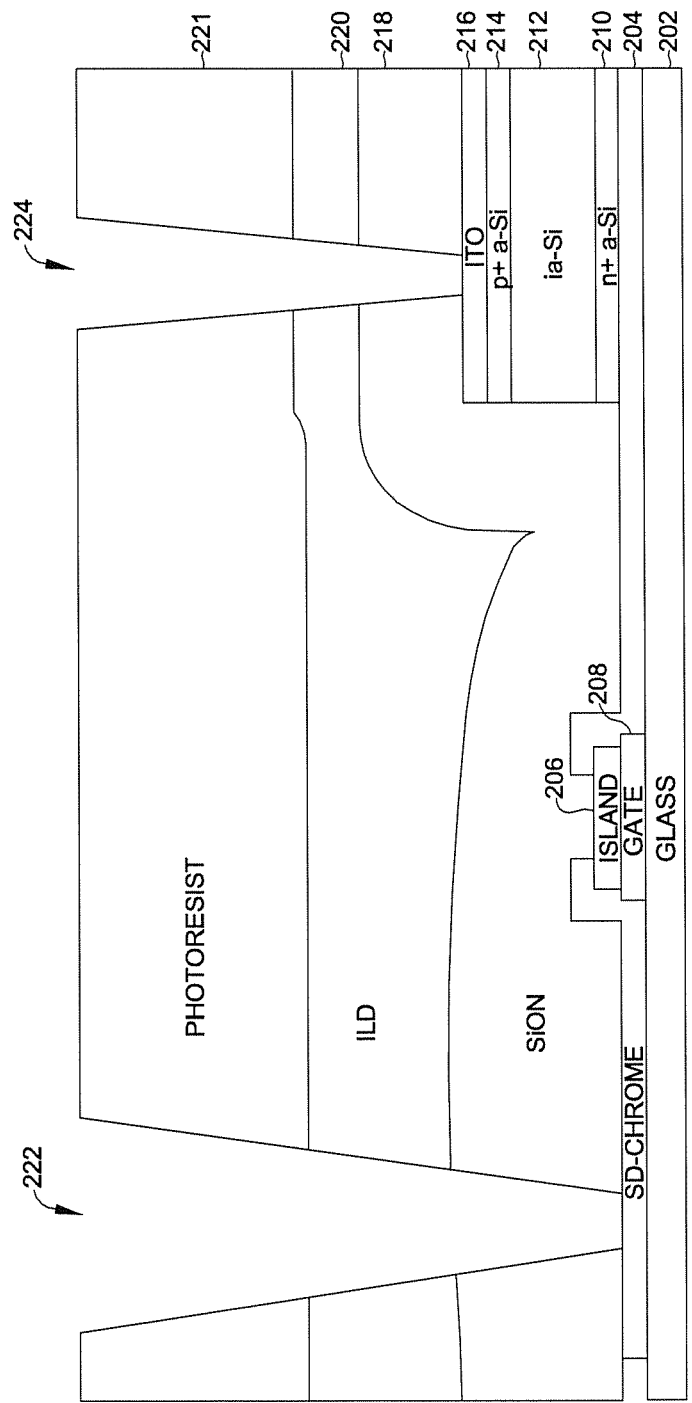
Figure 17:
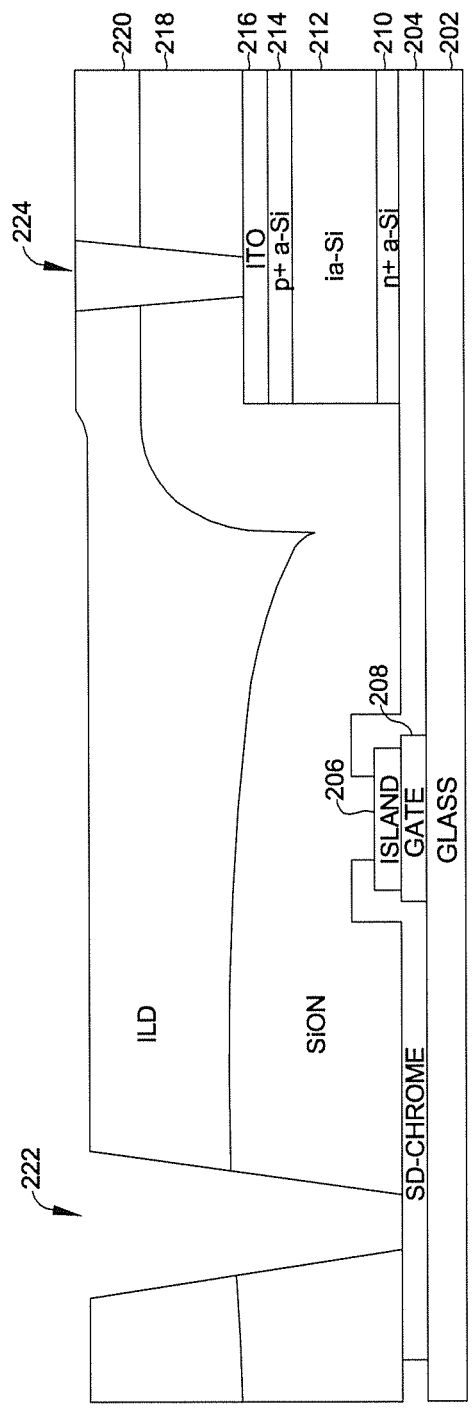
Figure 18:
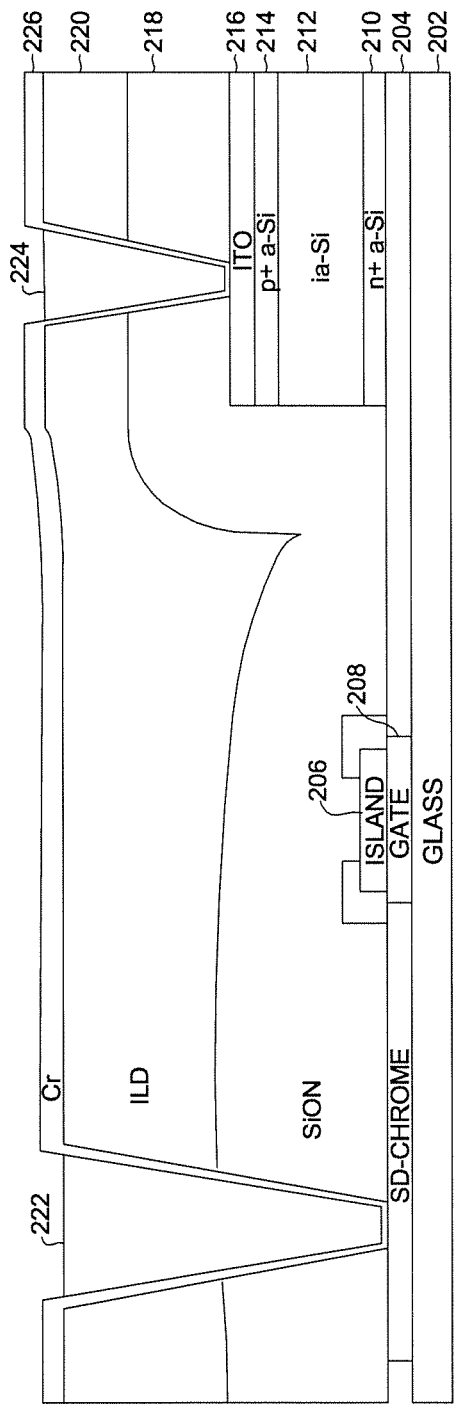
Figure 19:
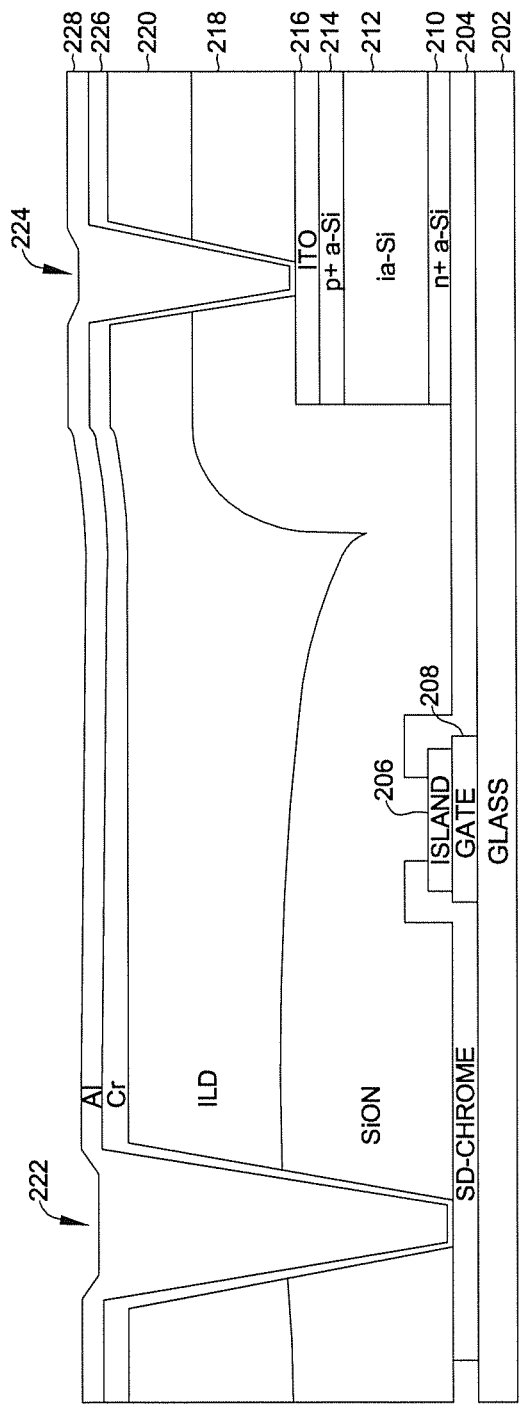
Figure 20:
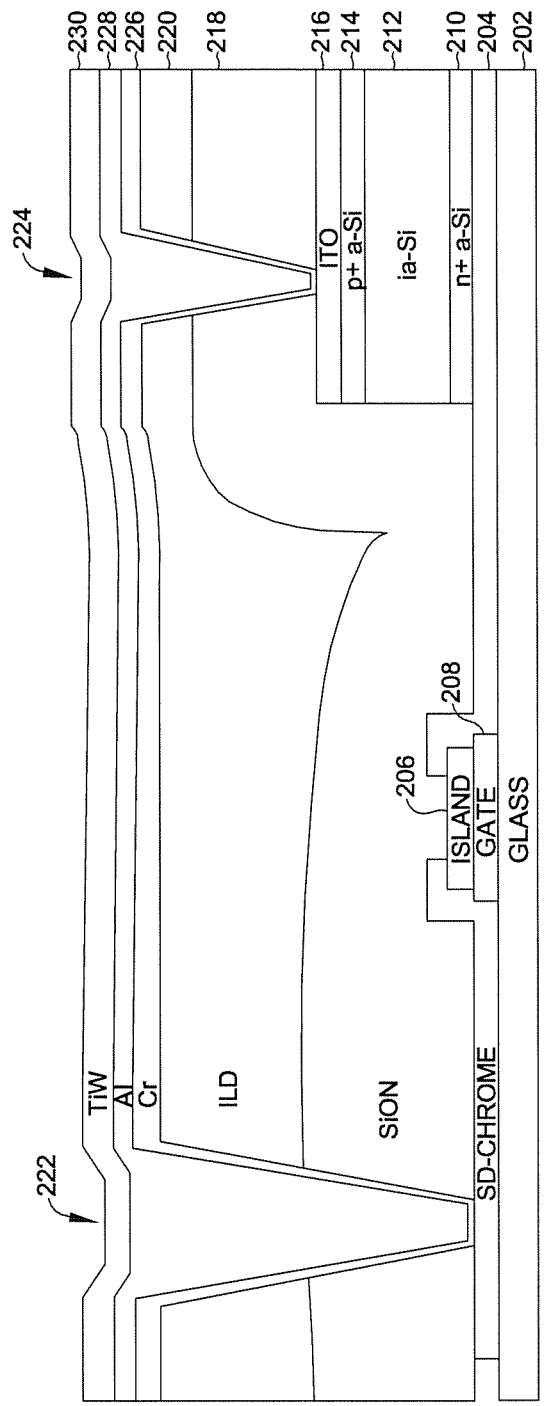
Figure 21:
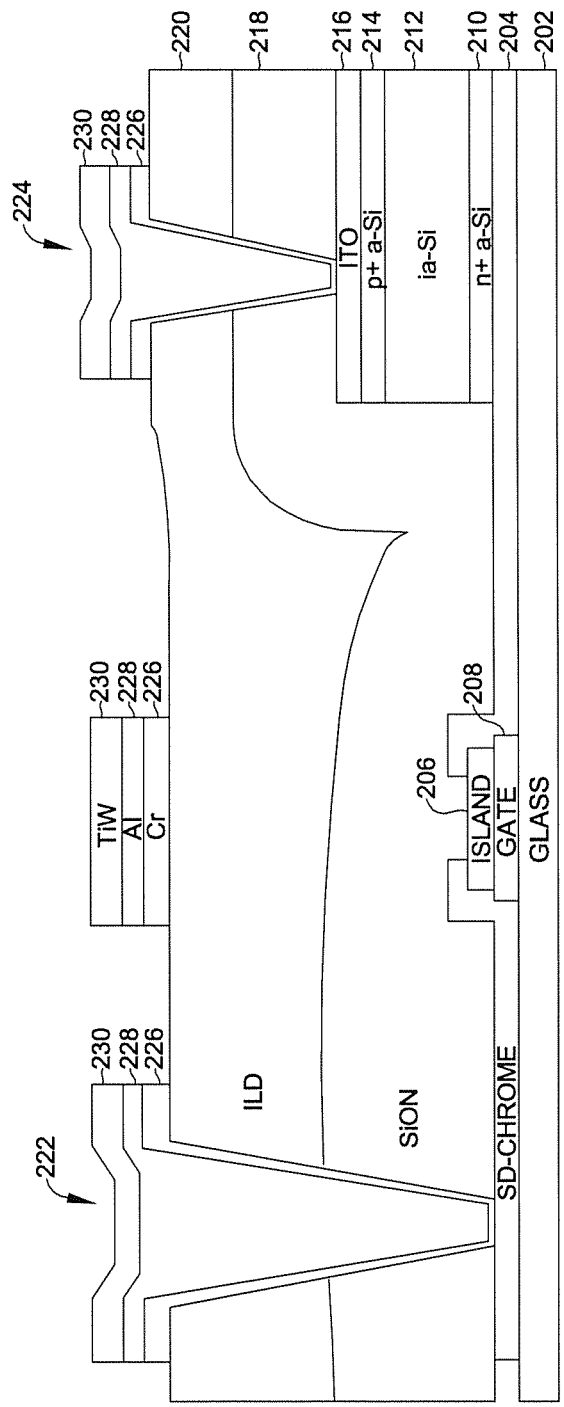
Figure 22:
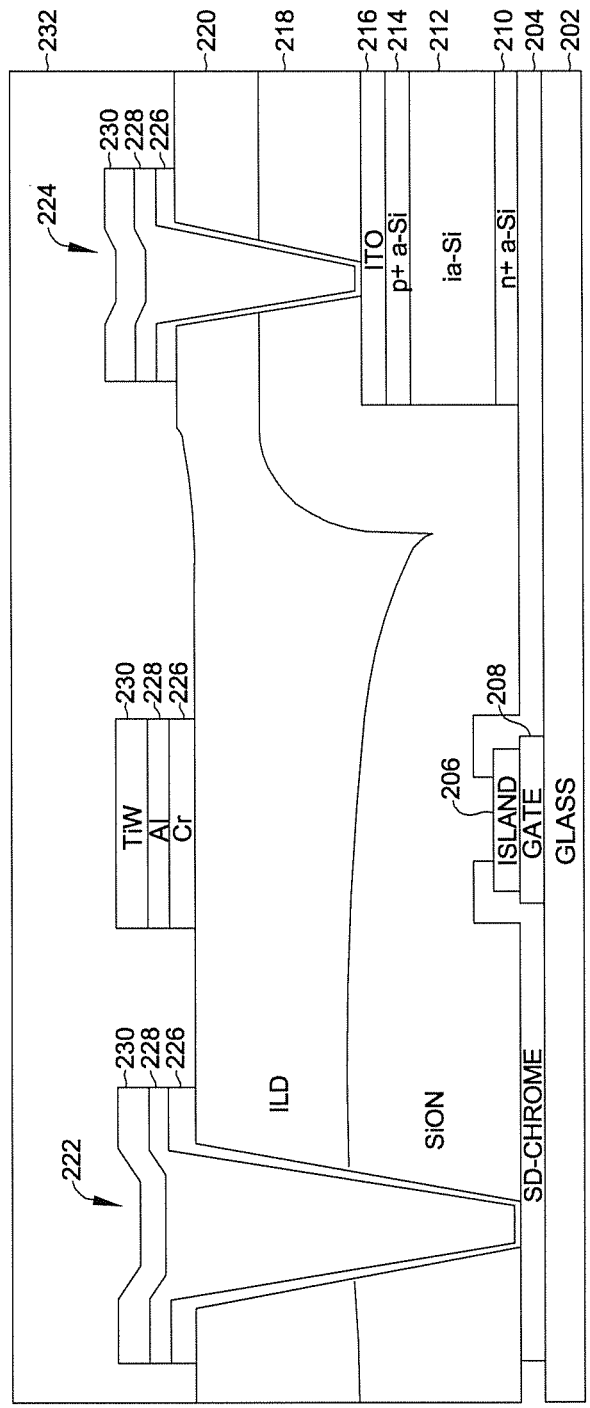

Referring now to FIG. 16, following development and inspection the ILD/SiON hybrid stack is etched in a Fluorine (i.e., CF4, SF6, etc.) containing plasma process to form vias 222 and 224. Via 222 extends down to the chrome metal layer 204 and via 224 extends down to the ITO layer 216 of the diode stack.

FIGS. 17-22 correspond generally to previously described FIGS. 5-10, but now including corresponding metal layers 226, 228, 230, and passivation layer 232.

Figure 23:
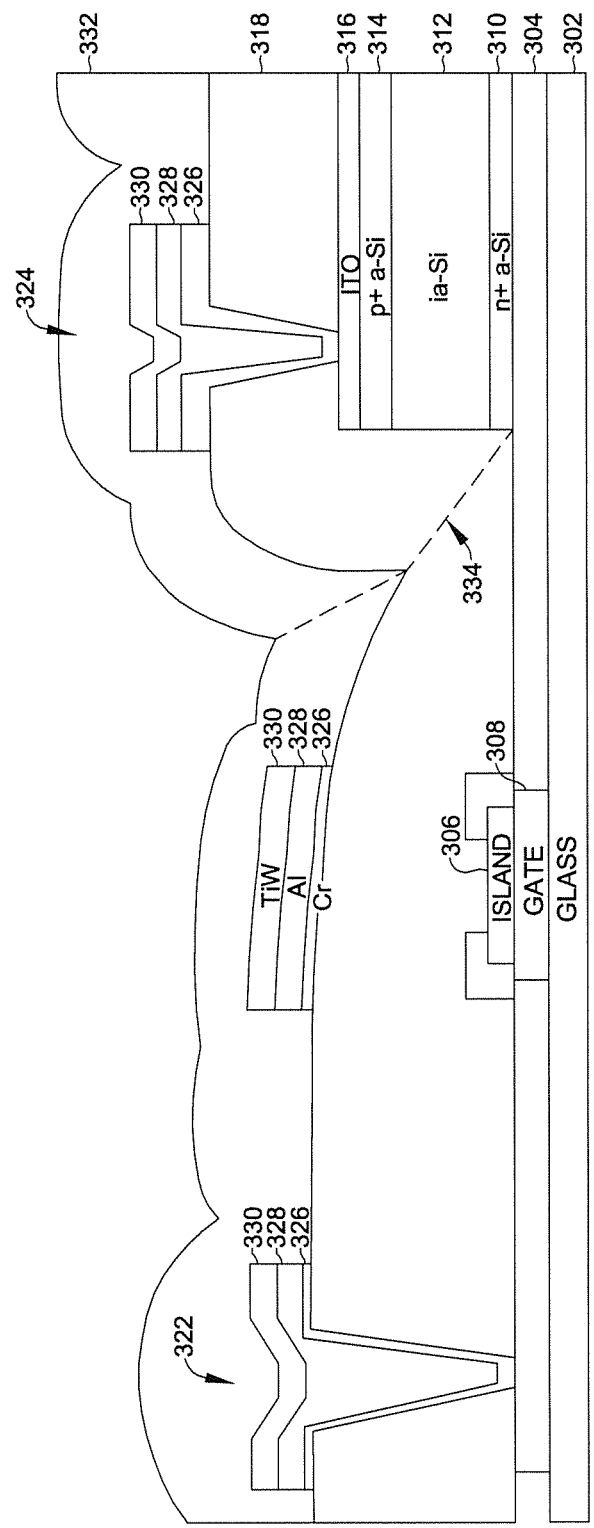
FIG. 23 is a cross-sectional diagram of a large area amorphous silicon image array according to the prior art.

It is an advantage of the present invention that depositing the dielectric material using a CVD tool produces a conformal surface on top of the imaging array sensor. The film contains a seam between features comprising the reliability of the imaging array. This seam is propagated as more layers are deposited on top using either CVD or PVD tools. An example in FIG. 23 was shown and previously described.

This creates a potential means by which a contaminant, such as water vapor, can enter into the device and deteriorate the function and performance of the imaging array. A liquid dielectric applied by means of a coater allows the dielectric to form a planarized layer, and thus allow subsequent CVD layers to better encapsulate the imaging array from any outside contaminants. This improves the longevity of the device function and performance. An example of the planarized, multilayer hybrid imaging sensor of the present invention is shown below.

The current dielectric material, deposited by means of CVD, typically, has a higher dielectric constant. This contributes to parasitic capacitances, such as dataline, gateline and data-to-gate capacitances, of the array and thus degrades the performance of the components of the imaging array. The conformality of the dielectric films also contributes to the parasitic capacitances of the array and thus degrades the performance of the imaging array. The liquid dielectric material has a lower dielectric constant of typical CVD film. This improves the performance of the imaging array because dataline capacitance is reduced by approximately 20%, and gateline capacitance is reduced by approximately 10%.

The planarity of the liquid dielectric also isolates the imaging array components better, thus contributing to the performance by reducing the parasitic capacitances.

It should be noted, however, that the manufacturing process according to the present invention creates an additional step in producing the imaging array because a CVD-deposited capping layer is required on top of the imaging array sensor before the liquid dielectric material can be applied.

It should also be noted that the ILD chemical's adhesion to other materials can be an issue. The film upon which the ILD chemical is being applied needs to be treated such that adhesion will be sufficient to withstand delamination.

Finally, sensitivity of the hybrid, planarized, multilayer sensor array can produce a difference in sensitivity, or responsiveness to light. This is caused by the differences in the index of refraction and transmission of the ILD materials compared with the SiON capping layer.

In summary, a new architecture for manufacturing a digital image sensor is proposed wherein a combination of CVD based and solution based dielectrics are combined in a singular 'hybrid' layer to improve the overall performance and reliability of the device. Two processing routes have been shown. A first manufacturing process uses a photo-exposable ILD material which acts as a replacement to photoresist in the etch of the CVD film. A second manufacturing process uses a dry-etchable ILD material wherein the ILD material and CVD material are etched as a homogenous layer. Both approaches achieve the same end result without the need for any additional masking steps.

Although an embodiment of the present invention has been described for purposes of illustration, it should be understood that various changes, modifications and substitutions may be incorporated in the embodiment without departing from the spirit of the invention that is defined in the claims, which follow. For example, the planarized structure and/or materials of the present invention could be incorporated into the passivation layer. The planarized ILD layer process of the present invention could also be applied to manufacturing flexible, digital imaging arrays. Another application for the planarized structure and/or materials of the present invention could also be used to create a planarized TFT layer.

The invention claimed is:

1. A method of manufacturing a flat panel image sensor comprising:
   providing a thin film transistor (TFT) and diode array;
   applying a conformal insulating layer on a top surface of the TFT and diode array;
   depositing a planarized dielectric layer on a top surface of the conformal insulating layer;
   photoexposing the planarized dielectric layer;

forming a first via in the planarized dielectric layer and the conformal insulating layer to expose a metalized portion of the TFT and diode array;

forming a second via in the planarized dielectric layer and the conformal insulation layer to expose a diode portion of the TFT and diode array;

metalizing the first and second vias; and passivating the first and second vias and an upper surface of the planarized dielectric layer.

2. The method of claim 1 wherein the conformal insulating layer comprises SiON, $SiO_2$, or SiN.

3. The method of claim 1 wherein the conformal insulating layer is applied using plasma-enhanced chemical vapor deposition (PECVD).

4. The method of claim 1 wherein the planarized dielectric layer comprises a photoexposable material.

5. The method of claim 1 wherein the planarized dielectric layer is deposited using a solution based process.

6. The method of claim 1 wherein the first and second vias are formed using either a wet or a dry etch using the exposed and patterned planarized dielectric layer as an etch mask.

7. The method of claim 1 wherein the metalized first and second vias are metalized using a tri-layer metal stack including chromium, aluminum, and titanium tungsten.

8. A method of manufacturing a flat panel image sensor comprising:

providing a thin film transistor (TFT) and diode array;

applying a conformal insulating layer on a top surface of the TFT and diode array;

depositing a planarized dielectric layer on a top surface of the conformal insulating layer;

applying a photoresist layer to an upper surface of the planarized dielectric layer;

photoexposing the photoresist layer;

forming a first via in the photoresist layer, the planarized dielectric layer, and the conformal insulating layer to expose a metalized portion of the TFT and diode array;

forming a second via in the photoresist layer, the planarized dielectric layer, and the conformal insulating layer to expose a diode portion of the TFT and diode array;

stripping the photoresist layer;

metalizing the first and second vias; and passivating the first and second vias and an upper surface of the planarized dielectric layer.

9. The method of claim 8 wherein the conformal insulating layer comprises SiON, $SiO_2$, or SiN.

10. The method of claim 8 wherein the conformal insulating layer is applied using plasma-enhanced chemical vapor deposition (PECVD).

11. The method of claim 8 wherein the planarized dielectric layer comprises a photoexposable material.

12. The method of claim 8 wherein the planarized dielectric layer is deposited using a solution based process.

13. The method of claim 8 wherein the first and second vias are formed using either a wet or a dry etch using the exposed and patterned photoresist layer as an etch mask.

14. The method of claim 8 wherein the metalized first and second vias are metalized using a tri-layer metal stack including chromium, aluminum, and titanium tungsten.

15. A flat panel image sensor comprising:

a thin film transistor (TFT) and diode array;

a conformal insulating layer on a top surface of the TFT and diode array;

a planarized dielectric layer on a top surface of the conformal insulating layer;

a first metalized via in the planarized dielectric layer and the conformal insulating layer to contact a metalized portion of the TFT and diode array;

a second metalized via in the planarized dielectric layer and the conformal insulation layer to contact a diode portion of the TFT and diode array; and a passivation layer over the first and second vias and an upper surface of the planarized dielectric layer.

16. The sensor of claim 15 wherein the conformal insulating layer comprises SiON, $SiO_2$, or SiN.

17. The sensor of claim 15 wherein the conformal insulating layer has a thickness of about one-half to two microns.

18. The sensor of claim 15 wherein the planarized dielectric layer comprises a photoexposable material.

19. The sensor of claim 15 wherein the planarized dielectric layer has a thickness of about one to six microns.

20. The sensor of claim 15 wherein the metalized first and second vias comprise a tri-layer metal stack including chromium, aluminum, and titanium tungsten.

21. The sensor of claim 15 wherein the metalized first and second vias comprise a four layer conductor stack.

22. The sensor of claim 21 wherein the four layer conductor stack comprises chromium, aluminum, titanium, and a transparent conductor.

* * * * *